(12) United States Patent
Yu et al.

(10) Patent No.: US 11,556,680 B1
(45) Date of Patent: Jan. 17, 2023

(54) TEST METHOD BASED ON TEST SYSTEM FOR FIVE-DIMENSIONAL SPACE EFFECTS OF GROUND SURFACE SETTLEMENT CAUSED BY DUAL-MODE SHIELD CONSTRUCTION

(71) Applicants: Qingdao University of Technology, Qingdao (CN); China Construction Fifth Engineering Division Corp, Baoding (CN); Guilin University of Technology, Guilin (CN)

(72) Inventors: Guangming Yu, Qingdao (CN); Penghui Zhang, Qingdao (CN); Jun Lei, Qingdao (CN); Bin Peng, Qingdao (CN); Lijun Kuang, Qingdao (CN); Weiting Luo, Qingdao (CN); Zihan Yang, Qingdao (CN); Xinpeng Yao, Qingdao (CN); Zhiwen Tan, Qingdao (CN); Qiang Yue, Qingdao (CN); Jiaming Du, Qingdao (CN); Ze Chen, Qingdao (CN); Hao Liu, Qingdao (CN); Li Zhang, Qingdao (CN); Shuguang Zhang, Qingdao (CN)

(73) Assignees: Qingdao University of Technology, Qingdao (CN); China Construction Fifth Engineering Division Corp., Ltd., Baoding (CN); Guilin University of Technology, Guilin (CN)

( * ) Notice: Subject to any disclaimer, the term of this patent is extended or adjusted under 35 U.S.C. 154(b) by 0 days.

(21) Appl. No.: 17/878,769

(22) Filed: Aug. 1, 2022

(30) Foreign Application Priority Data

Jan. 27, 2022 (CN) .................... CN202210101179

(51) Int. Cl.
*E21D 9/06* (2006.01)
*G06F 30/17* (2020.01)
(Continued)

(52) U.S. Cl.
CPC ............... *G06F 30/17* (2020.01); *E21D 9/08* (2013.01); *G06F 30/20* (2020.01)

(58) Field of Classification Search
CPC .. E21D 9/00; E21D 9/08; E21D 9/003; E21D 9/06; E21D 9/0642; G01V 3/17;
(Continued)

(56) References Cited

U.S. PATENT DOCUMENTS 4,165,129 A * 8/1979 Sugimoto ............. E21D 9/0879
299/56
5,106,163 A * 4/1992 Fujiwara ................... E21D 9/10
299/33
(Continued)

OTHER PUBLICATIONS

Hao et al.; "Analysis of Ground Settlement Caused by Double-line TBM Tunneling under Existing Building"; all; Jun. 22, 2021 (Year : 2021).*
(Continued)

*Primary Examiner* — Benjamin F Fiorello
(74) *Attorney, Agent, or Firm* — Bauer Law Offices; Gregory P. Raymer; Robert M. Bauer

(57) ABSTRACT

A test method based on a test system for five-dimensional space effects of ground surface settlement caused by dual-mode shield construction is provided. First, manufacturing a formation similarity material model; then, laying ground surface monitoring points in longitudinal and transverse direction; installing a shield machine model, and performing shield construction, the shield machine model adopts a double-shield body mode; performing five-dimensional monitoring during shield construction; designing an observation method for ground surface settlement data in step
(Continued)

length and time dimension, and acquiring five-dimensional data in combination with three-dimensional scanning; and finally, performing deformation information processing according to the monitored data, so as to realize an acquisition of the five-dimensional data.

9 Claims, 10 Drawing Sheets

(51) Int. Cl.
*E21D 9/08* (2006.01)
*G06F 30/20* (2020.01)

(58) Field of Classification Search
CPC ...... G01V 33/005; G01V 11/00; G06F 30/17; G06F 30/26
See application file for complete search history.

(56) References Cited

U.S. PATENT DOCUMENTS

| | | | |
|---|---|---|---|
| 9,989,671 B2* | 6/2018 | Li | G01V 11/00 |
| 2017/0306757 A1* | 10/2017 | Li | E21D 9/003 |
| 2020/0018164 A1* | 1/2020 | Wang | E21D 9/003 |
| 2021/0010809 A1* | 1/2021 | Ye | G01C 15/06 |
| 2022/0228486 A1* | 7/2022 | Ye | G01N 3/068 |

OTHER PUBLICATIONS

Hu. et al.; "Ground surface settlement analysis of shield tunneling under spatial variability of multiple geotechnical parameters"; all; Sep. 17, 2019 (Year: 2019).*

Song et al.; "Study on Surface Settlement Law of Shield Construction in Mudstone Stratum"; all; 2021 (Year: 2021).*

Hassanpour et al.; "Maximum surface settlement prediction in EPB TBM tunneling using soft computing techniques"; all; 2021 (Year : 2021).*

* cited by examiner

TEST METHOD BASED ON TEST SYSTEM FOR FIVE-DIMENSIONAL SPACE EFFECTS OF GROUND SURFACE SETTLEMENT CAUSED BY DUAL-MODE SHIELD CONSTRUCTION

CROSS REFERENCE TO RELATED APPLICATION

This patent application claims the benefit and priority of Chinese Patent Application No. 202210101179.4, entitled "TEST METHOD BASED ON TEST SYSTEM FOR FIVE-DIMENSIONAL SPACE EFFECTS OF GROUND SURFACE SETTLEMENT CAUSED BY DUAL-MODE SHIELD CONSTRUCTION" filed on Jan. 27, 2022, the disclosure of which is incorporated by reference herein in its entirety as part of the present application.

TECHNICAL FIELD

The present disclosure belongs to the technical field of shield models, and particularly, relates to a similarity simulation test method for "five-dimensional" space effects of ground surface settlement caused by shield construction.

BACKGROUND ART

Shield machine is mainly divided into a Tunnel Boring Machine (TBM) for tunneling a hard rock interval, an Earth Pressure Balance Shield Machine (EPB) for tunneling a soft rock interval, and a dual-mode shield construction under complex formation conditions. However, a TBM method, an EPB method, or a dual-mode shield method has common construction characteristics during construction, that is, there is a process of propulsion by the shield machine and a process of installing the segments. It can be known by analyzing these two specific operation conditions that the process of propulsion by the shield machine will generate disturbance to stratum soil. For example, the shield propulsion step length used in a certain rail transit line is 1.5 m, which causes ground surface settlement inevitably. In the process of installing the segments after each propulsion step length is completed, it usually needs to shut down the machine for about 40 minutes. A phenomenon of the ground surface settlement still occurs continuously during this period of time.

To sum up specific engineering situations mentioned above, with a shield tunnel being continuously tunneled, the phenomenon of the ground surface settlement will occur. The ground surface settlement not only spreads in the three dimensions of X, Y, and Z, but also continuously evolves along with the two dimensions of the tunneling step length (L) and time (T) for the shield tunnel. Therefore, they are defined as a "five-dimensional" space effect of the ground surface settlement caused by the shield tunnel construction.

At present, the total amount of the ground surface settlement is mostly predicted by using finite element software or a Peck formula. Finite element calculation needs to establish an accurate model. However, physical properties of each layer of rock in a real formation environment are ever-changing, so it is very difficult to model. The Peck formula is a simple method for calculating the ground surface settlement, whereas there are many assumptions in usage of the formula, so there will be great errors in calculation results.

Test systems or test methods for traditional models can only perform qualitative studies generally because they need to simplify prototypes and are limited in terms of similarity material, boundary conditions, the size effect of test equipment, consolidation drainage, and the like, which is difficult to accurately reflect the "five-dimensional" effects of the ground surface settlement. Therefore, there are great limitations on the study of an evolution law of a ground surface settlement tank. And, there are great difficulties in terms of transformation from test results to the prototypes, direct usage in construction control, and the like.

SUMMARY

In view of the defects of the prior art, the present disclosure provides a test method based on a test system for a five-dimensional space test effects of ground surface settlement caused by dual-mode shield construction, so as to simulate a ground surface settlement situation caused by the construction of a prototype shield machine to the greatest extent. In this way, there is a guide for the construction of a shield machine in practical engineering, the protection of ground surface buildings and underground pipeline, and the like according to observation data by intuitively observing a settlement law of the ground surface.

The present disclosure is implemented by using the following technical solutions; a test method based on a test system for five-dimensional space effects of ground surface settlement caused by dual-mode shield construction, the test system including a test model box, a test monitoring system, and a shield machine model, the test model box being configured for simulating geological conditions in actual construction; the test method including: manufacturing a model with stratum similarity material: acquiring a geological exploration report of a region to be studied, and determining a test similarity ratio based on the geological exploration report in combination with a determination method of the similarity ratio, so as to manufacture the model with stratum similarity material based on the similarity ratio; arranging ground surface monitoring points in a longitudinal direction and a transverse direction: detecting an accuracy of the test monitoring system to select resolution suitable for the test method, and arranging the test monitoring system; installing the shield machine model, and performing shield construction; adopting a double-shield body mode for the shield machine model, and enabling the shield machine model to include an inner shield body (2) and an outer shield body (3) nested together, thrust rods (5), propulsion devices (6), and cleaners for muck (7); setting a front part of the outer shield body (3) to be a local hollow area (31); arranging corbel-like members (4) between the inner shield body (2) and the outer shield body (3); fixing one end of each of the thrust rods (5) to a corresponding one of the corbel-like members (4), and connecting an other end of the thrust rod (5) to a corresponding one of the propulsion devices (6); connecting the corresponding one of the propulsion devices (6) simultaneously to a respective one of the cleaners for muck (7); arranging a cutter head (10) with a cutter on a front part of the shield machine model; connecting the cutter head (10) to a rotating motor (13) through a torque rod (12); connecting the rotating motor (13) to an alternating current power supply (14); driving the torque rod (12) through rotation of the rotating motor (13), so as to drive the cutter head (10) to rotate to cut soil of the model with stratum similarity material; performing five-dimensional monitoring: designing an observation method for ground surface settlement data in terms of propulsion step lengths and time dimension, and acquiring five-dimensional data by the observation method in combination with three-dimensional scanning; observing influence of the propulsion step lengths on the ground surface monitoring points through continuous propulsion of the shield machine model and performing three-dimensional scanning record; monitoring the time dimension by changing downtime of the shield machine model; and performing information processing for ground surface deformation based on the ground surface settlement data in terms of propulsion step lengths and time dimension monitored in step of performing five-dimensional monitoring, so as to acquire the five-dimensional data.

Further, arranging ground surface monitoring points in the longitudinal direction and the transverse direction includes: adopting a three-dimensional laser scanner for the test monitoring system; arranging the ground surface monitoring points on a surface of the model with stratum similarity material placed in the test model box; enabling a starting point and an end point to be away from a boundary of the test model box to be not affected by conditions of the boundary.

Further, observing influence of the propulsion step lengths on the ground surface monitoring points through continuous propulsion of the shield machine model and performing three-dimensional scanning record includes: setting a constant propulsion speed P of the shield machine model, setting a size Q of each of the propulsion step lengths, and setting the constant propulsion speed P and the size Q to be constant values in one test; recording test observation data of the ground surface monitoring points in the longitudinal direction under influence of the constant propulsion step lengths, and test observation data of the ground surface monitoring points in the transverse direction under influence of the constant propulsion step lengths.

Further, monitoring the time dimension by changing the downtime of the shield machine model specifically includes: acquiring the five-dimensional data under two different time dimension influences in a shutting-down mode of the shield machine model, acquiring two different time dimension influences includes: pushing the shield machine model for construction, selecting a shutdown position of the shield machine model, and recording the five-dimensional data at the ground surface monitoring points along with increase of the downtime of the shield machine model; and performing data acquisition of the ground surface monitoring points after the shield machine model is pushed over the the ground surface monitoring points, during one test, setting a constant propulsion speed P' of the propulsion of the shield machine model, and setting a size Q' of each of the propulsion step lengths, setting the constant propulsion speed P' and the size Q' to be constant values in the one test; and making a test observation record sheet under one of the two time dimension influences at the ground surface monitoring points, so as to record the five-dimensional data.

Further, installing the shield machine model, and performing shield construction includes: enabling the thrust rods (5) to be hollow internally; forming a hole in a side wall of one end, close to the corbel-like members (4), of each of the thrust rods (5); locating the thrust rods (5) between the inner shield body (2) and the outer shield body (3), and arranging the plurality of the thrust rods (5) uniformly in a circumferential direction of the inner shield body.

Further, arranging anti-instability triangular braces (9) for supporting the thrust rods (5) between the inner shield body (2) and the outer shield body (3); and enabling a supporting spacing between every adjacent two of the triangular braces (9) to be one-tenth a length of the shield machine model.

Further, enabling a hollow range of the hollow area (31) to be one-fourth to one-third a length of the shield machine model.

Further, arranging muck retaining plates (15) at a position from one-third to one-half a front end of the shield machine model; arranging the muck retaining plates (15) between the inner shield body (2) and the outer shield body (3), and locating the muck retaining plates (15) behind the hollow area (31); and forming a sealed space at a space in front of the muck retaining plate (5).

Further, manufacturing a model with stratum similarity material includes: placing the model with stratum similarity material after being manufactured into the test model box; enabling the test model box to include a box body (1) with an opening in an upper part thereof; simulating similarity stratum in the box body; installing tempered glass plates on sides of the box body; installing a steel plate on a bottom of the box body; connecting every adjacent two of the tempered glass plates by using double-leg angle steel (11), and using sealant to improve sealing performance; and simulating material of stratum rock by using the stratum similarity material to be similar to the stratum rock, the stratum similarity material includes quartz sand, mica, barite powder, river sand, and cement; and pouring the model with the stratum similarity material in layers and vibrating and compacting manually the model with the stratum similarity material.

Compared with the prior art, the present disclosure has the advantages and positive effects as follows.

In the present solution, a ground surface settlement effect caused by shield construction is physically simulated in five dimensions by a similarity material simulation technology, so as to determine a step length effect and a time effect of the ground surface settlement caused by shield construction. In this way, the study of a settlement effect in five dimensions is realized, and a required "five-dimensional" law from a model test may be directly extracted. Further, an evolution law of a ground surface settlement tank may be studied, thereby providing technical support for revealing and analyzing space and time characteristics of the ground surface settlement caused by shield tunnel construction, and determining the evolution law of the ground surface settlement under the influence of the shield step length and the influence of the time effect.

DETAILED DESCRIPTION OF THE EMBODIMENTS

In order to understand the abovementioned objective, features, and advantages of the present disclosure more clearly, the present disclosure is further described below with reference to the accompanying drawings and embodiments. Many specific details are set forth in the following description to facilitate full understanding of the present disclosure. However, the present disclosure can also be implemented in other ways different from those described here. Therefore, the present disclosure is not limited to the specific embodiments disclosed below.

Figure 1:
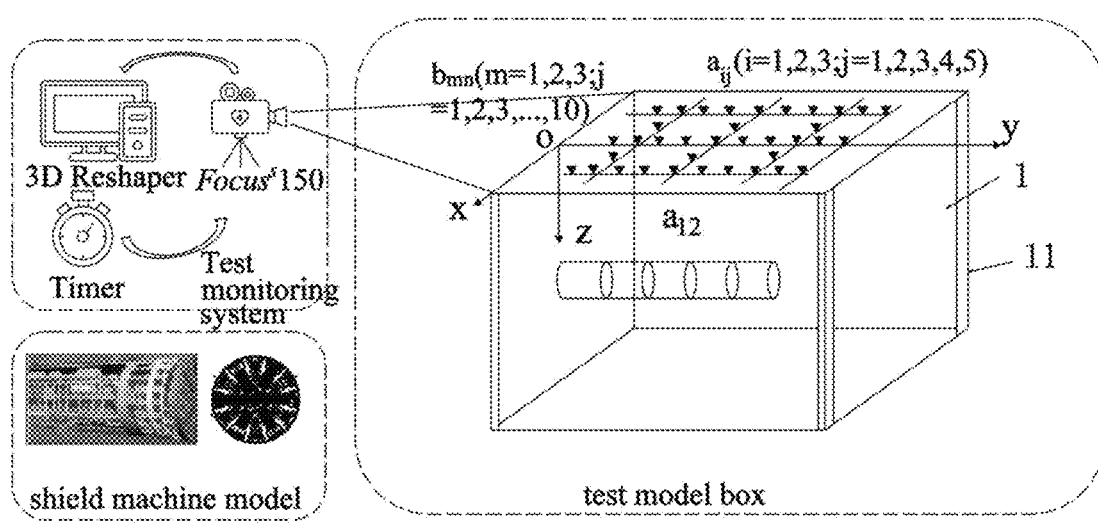
FIG. 1 is a schematic diagram of a similarity simulation test system for five-dimensional effects of ground surface settlement caused by shield tunnel construction according to the embodiments of the present disclosure.

In embodiments, a test method based on a test system for five-dimensional space effects of ground surface settlement caused by dual-mode shield construction is as shown in FIG. 1, which is a schematic system of the test system. The test system includes a test model box, a test monitoring system, and a shield machine model. The test method based on a test system for five-dimensional space effects of ground surface settlement caused by dual-mode shield construction provided by the present embodiment specifically includes the following step A to step E.

In step A, a model with stratum similarity material is manufactured; a geological exploration report of a region to be studied is acquired, a test similarity ratio based on the geological exploration report in combination with a determination method of the similarity ratio is determined, so as to manufacture the model with stratum similarity material based on the similarity ratio;

In step B, ground surface monitoring points in a longitudinal direction and a transverse direction are arranged; an accuracy of the test monitoring system is detected to select resolution suitable for the test method, and arrange the test monitoring system;

In step C, the shield machine model is installed, and shield construction is performed;

In step D, five-dimensional monitoring is performed; design an observation method for ground surface settlement data in terms of propulsion step lengths and time dimension, and five-dimensional data is acquired by the observation method in combination with three-dimensional scanning;

In step D1, influence of the propulsion step lengths on the ground surface monitoring points is observed through continuous propulsion of the shield machine model, and three-dimensional scanning record is performed;

In step D2, the time dimension is monitored by changing downtime of the shield machine model; and In step E, information processing for ground surface deformation is performed based on the data monitored in Step D.

Specifically, a specific implementation process of the present solution is described below in detail.

In step A, when the similarity ratio is determined, for example, taking shield tunnels (in the form of intervals) of domestic urban subways as an example, most of the shield tunnels are shallow buried tunnels, and the buried depth thereof is generally 15-30 m. So, the variable burial depth at the position of a starting hole of the tunnel in the test model box is designed as 0.45-0.55 m. Therefore, the geometric similarity ratio C, of this model test system is recommended to range from 25 to 50. When the test system is used, the geometric similarity ratio may be properly selected within the range according to the factors such as the limitations of its own test site.

The determination of other similarity ratios may refer to the following formulas.

$$C_\sigma = C_l \times C_\gamma$$
$$C_\mu = C_\varphi = C_\varepsilon = 1$$
$$C_\sigma = C_E C_\varepsilon = C_E$$

In the formulas, $C_\sigma$ indicates a stress similarity ratio, $C_l$ indicates a geometric similarity ratio, $C_\gamma$ indicates a weight similarity ratio, $C_\mu$ indicates a Poisson ratio similarity ratio, $C_\varphi$ indicates a friction angle similarity ratio, $C_\varepsilon$ indicates a strain similarity ratio, and $C_E$ indicates an elastic modulus similarity ratio. For example, firstly, the weight similarity ratio of this test solution is determined as $C_\gamma=1$, and the geometric similarity ratio is determined as $C_l=30$, then it can obtain that $C_\sigma=30$, $C_E=30$.

Figure 2:
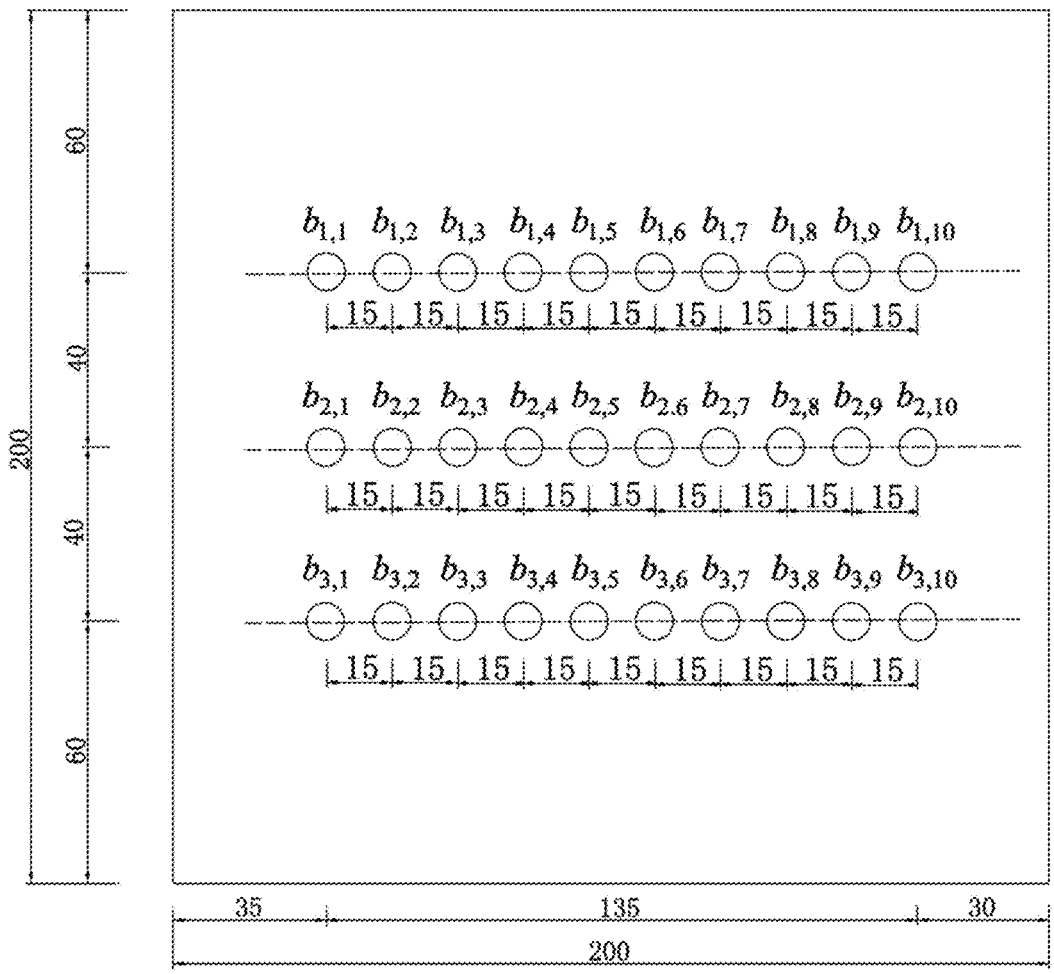
FIG. 2 is a layout diagram of longitudinal settlement monitoring points according to the embodiments of the present disclosure.
Figure 3:
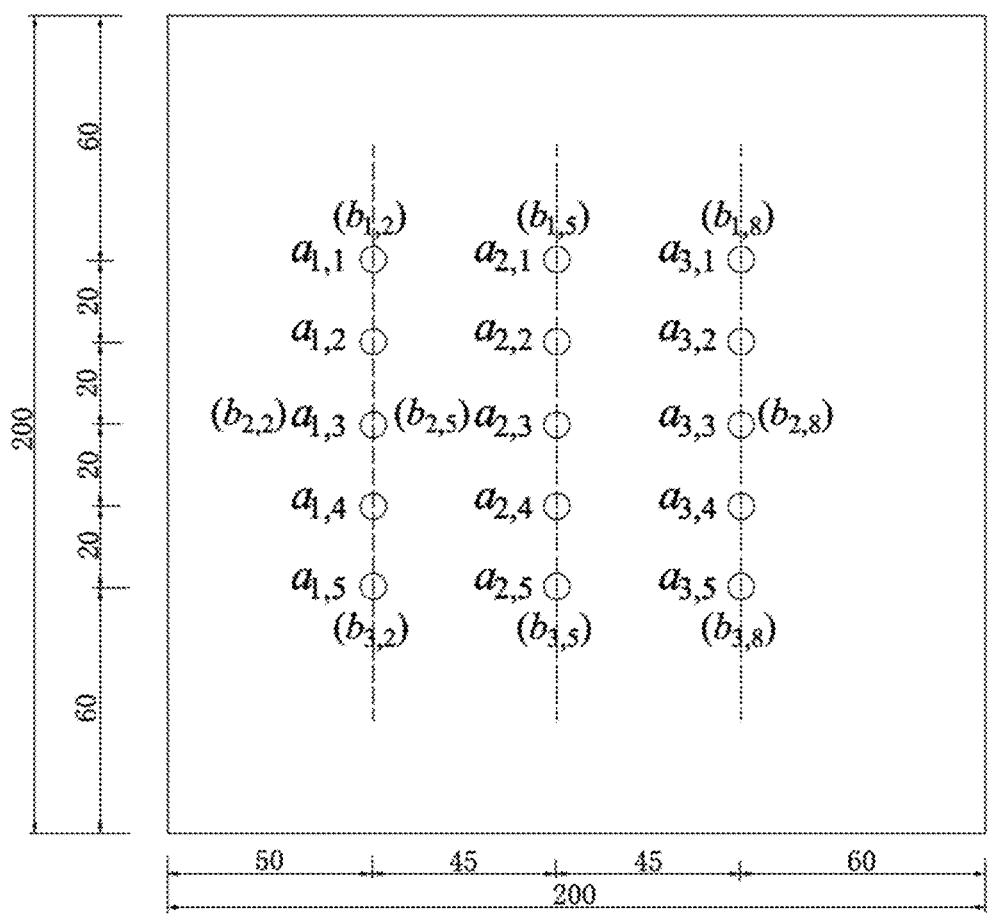
FIG. 3 is a layout diagram of transverse settlement monitoring points according to the embodiments of the present disclosure.

In step B, the layout of the ground surface monitoring points is as shown in FIG. 2 and FIG. 3, the present embodiment is described by taking three rows in the longitudinal direction and three rows in the transverse direction as an example. In specific implementation, the ground surface monitoring points may be arranged according to specific requirements of laboratory site.

Figure 9:
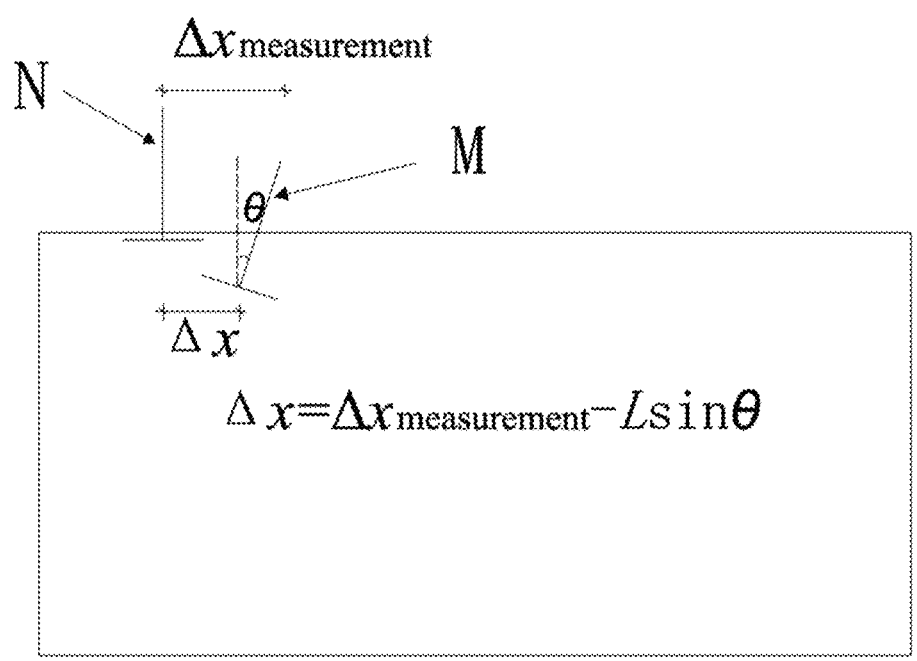
FIG. 9 is a schematic diagram of a ground surface monitoring probe in a front view of a model box according to the embodiments of the present disclosure.
Figure 10:
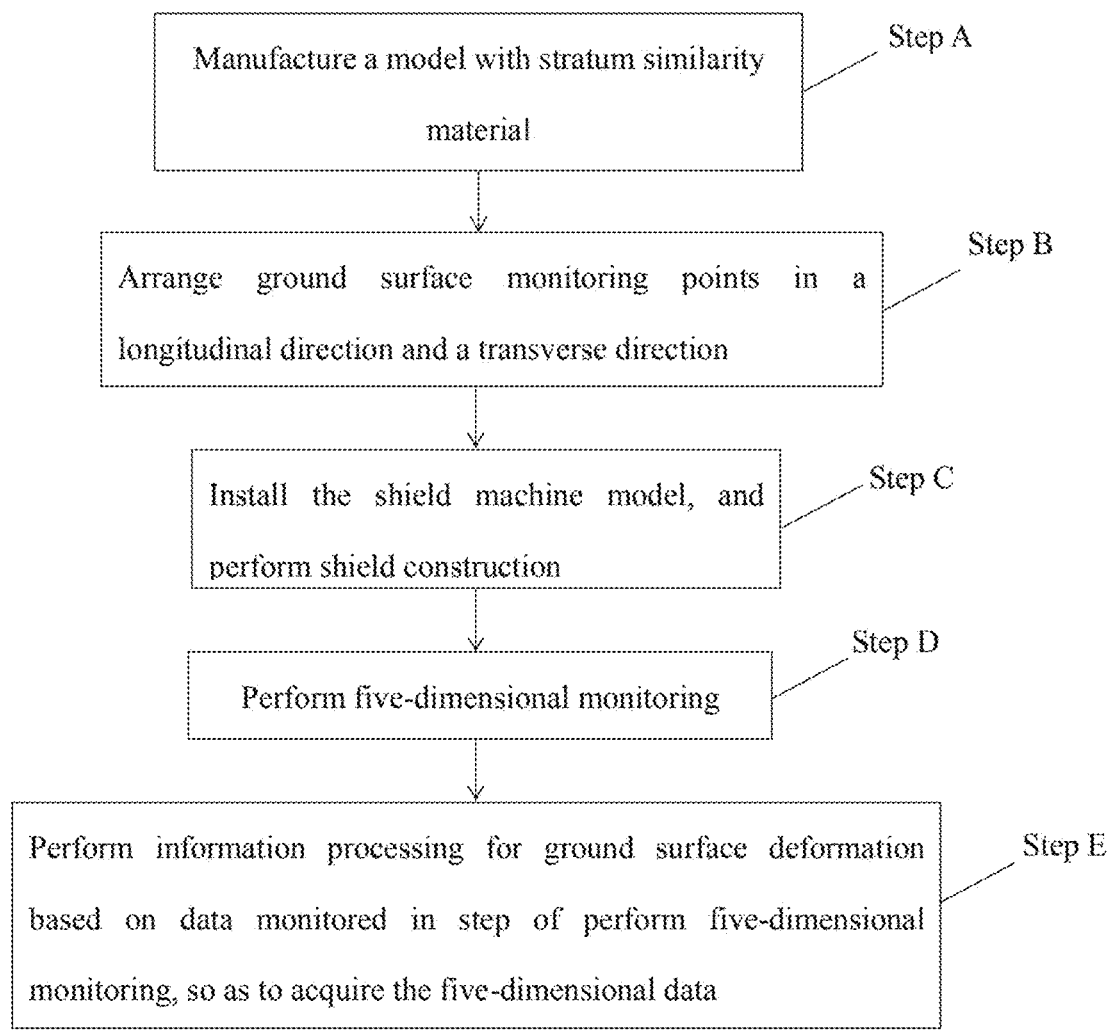
FIG. 10 is a schematic flow diagram of a test method based on a test system for five-dimensional space effects of ground surface settlement caused by dual-mode shield construction according to an embodiment of the present disclosure.

Specifically, three rows of numbers $a_{i,j}$ are arranged for the transverse monitoring points on ground surface settlement, and three rows of numbers $b_{m,n}$ are arranged for the longitudinal monitoring points on ground surface settlement, so as to observe the evolution law of a ground surface settlement tank in the longitudinal direction and the transverse direction. And, ground surface monitoring probe devices are arranged on the ground surface observation points, specifically as shown in FIG. 9. A symbol M indicates a state of a ground surface monitoring probe after the deformation of a ground surface, and a symbol N indicates a state of the ground surface monitoring probe before the deformation of the ground surface. Since the ground surface movement caused by tunnel construction is great in a vertical displacement direction, while the displacement amount is small in the horizontal direction, that is, the cross section direction x of a tunnel and a longitudinal section direction y of the tunnel, there may a situation that the measurement error is great. An effect of amplifying ground surface deformation can be achieved by monitoring the displacement of a probe tip during measurement by burying ground surface monitoring probe devices in the ground surface. However, the horizontal displacement of the ground surface and the displacement caused by an inclined angle are also coupled together, which can be separated through the following formula. Its function is that online monitoring of the displacement in the direction x and the direction y can be realized by monitoring the displacement of the probe tips by using a three-dimensional laser scanner. The following three functions can be realized through the length of the probe: first, the displacement effects in the direction x and the direction y are coupled with the displacement effect caused by an inclined angle of the ground surface, then the displacement caused by the inclined angle is removed by the formula $\Delta y = \Delta y_{measurement} - L \sin \theta$. In this formula, θ indicates an included angle between a position of a pointer after moving and the vertical direction, the included angle is equal to the inclined angle generated by the movement of the ground surface; and L indicates the length of the probe, and the actual displacement may be reversed (the direction x is the transverse direction of the tunnel, and the direction y is the longitudinal direction of the tunnel). Second, the measurement of the probe is easier than the measurement of a ground surface point. The probe can achieve an effect of marking. Third, the change law of the inclined angle of the ground surface can be accurately reflected, which is a crucial quantity for further enrichment and development of the five-dimensional theory.

The present embodiment adopts a three-dimensional laser scanner, and the accuracy test methods and the usage of the three-dimensional laser scanner are as follows.

Figure 4:
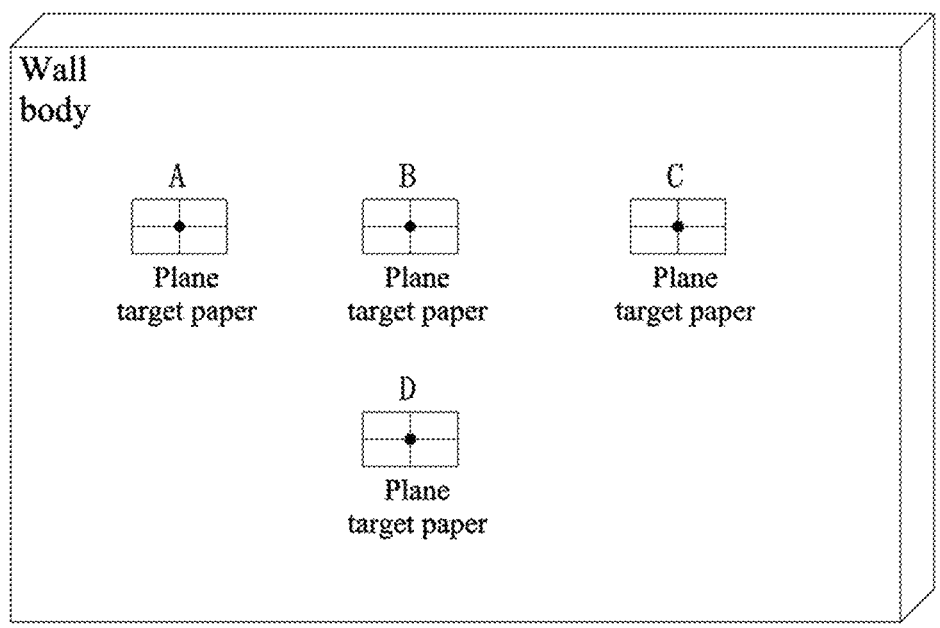
FIG. 4 is a layout diagram of a three-dimensional scanning accuracy test according to the embodiments of the present disclosure.

An accuracy test is performed by using a Focus$^s$ 150 scanner. Four pieces of plane target paper with a size of 0.16 m×0.12 m are respectively pasted on a wall surface, as shown in FIG. 4. Secondarily, the distance between a point A and a point B, the distance between a point B and a point C, and the distance between a point B and a point D are measured by using a total station. Then, stations are respectively set at 10 m, 20 m, 30 m, 40 m, and 50 m away from the wall surface for scanning, and each station adopts two resolutions, that is, an instrument default resolution 4×¼ and high-accuracy resolution 2×½. Scanning is performed for five times at each resolution, and mean square error curves of distances between the point A and the point B, between the point B and the point C, and between the point B and the point D at different resolutions are respectively drawn. An instrument error range is compared by fitting mean square error curves, so as to select a resolution suitable for the test solution.

In step C, a shield machine model is installed, and shield construction is performed.

The shield machine model provided by the present embodiment adopts a double-shield body mode, including an inner shield body 2 and an outer shield body 3 nested together. Both the inner shield body 2 and the outer shield body 3 are made by bending cold-formed thin-walled steel plates with strength and rigidity meeting the tunneling requirements of a shield machine model. The outer shield body 3 is arranged to be hollow in a certain range at a front part of the shield machine model (the front part of the outer shield body 3 is a local hollow area 31), preferably, the hollow range is one-fourth to one-third the length of the shield machine model. The inner shield body 2 is not arranged to be hollow, and is closed in the whole length range. The purpose of arranging the outer shield body 3 to be hollow is to simulate the formation loss during real shield construction. During testing, an overlying soil is disturbed, and soil can partially enter the inner shield body 2 through the hollow of the outer shield body 3 of the shield machine model.

In addition, a closed muck retaining plate 15 is arranged at the position of one-third to one-half a front end of the shield machine model. The closed muck retaining plates 15 are arranged between the inner shield body 2 and the outer shield body 3, and are located behind the hollow area 31. The effects of the closed muck retaining plate 15 include: first, muck at a front end from leaking is prevented from reaching rear ends of both the inner shield body 2 and the outer shield body 3, so as to better simulate the settlement caused by a propulsion process, and facilitate the measurement of the loss of soil; and second, a closed space is provided, which can effectively improve the muck absorption capacity of the cleaner for muck.

Figure 5:
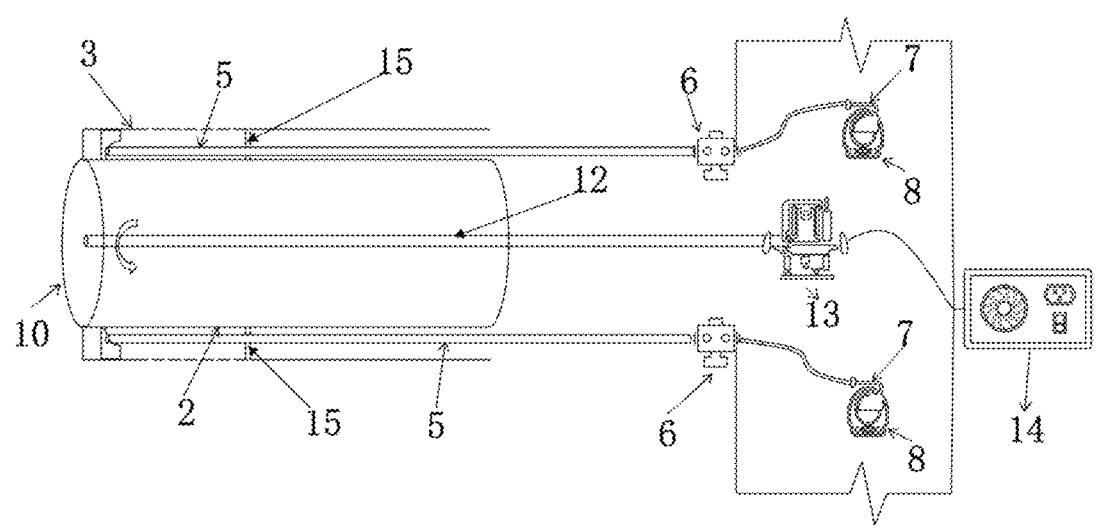
FIG. 5 is schematic diagram of an accurate control system of shield excavation equipment for a tunnel construction simulation test according to the embodiments of the present disclosure.
Figure 6:
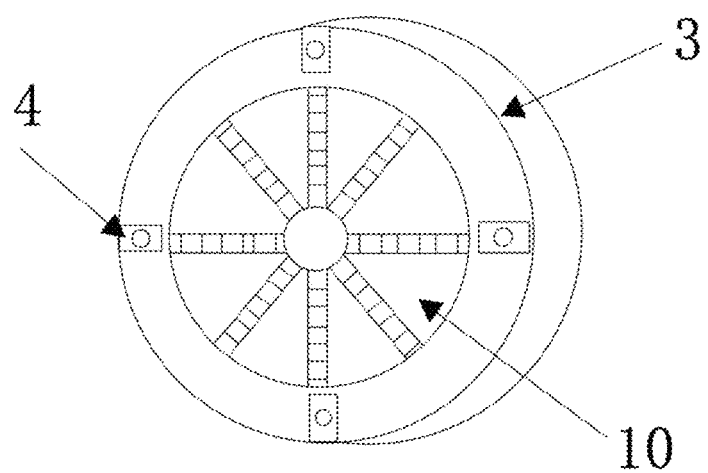
FIG. 6 is a layout diagram of thrust rods of a shield machine model according to the embodiments of the present disclosure.
Figure 7:
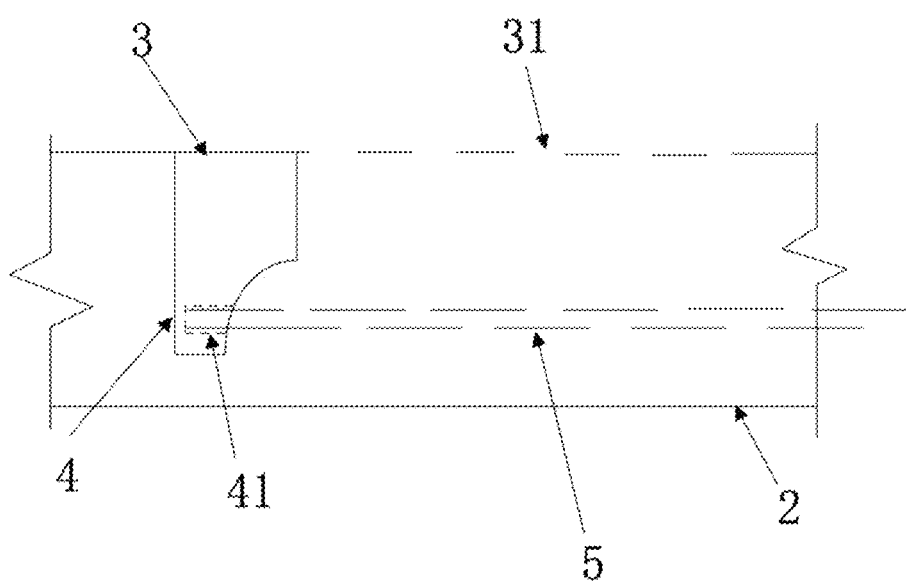
FIG. 7 is a schematic structural diagram of a propulsion model of a shield machine model according to the embodiments of the present disclosure.

Continuing to refer to FIG. 5 and FIG. 6, corbel-like members 4 are arranged between the inner shield body 2 and the outer shield body 3, and are welded on the inner side of the outer shield body 3. The corbel-like member 4 is as shown in FIG. 6. An embedded hole 41 is formed in the center. The embedded hole 41 is used for fixing metal thrust rods 5. Each of the thrust rods 5 is hollow internally, and is provided with a hole in a side wall which close to one end of the corbel-like member 4. The thrust rods 5 are located between the inner shield body 2 and the outer shield body 3, and arranged at every 90° in four directions of a circumference of the inner shield body. The other end of the thrust rod 5 is connected to a propulsion device 6. Meanwhile, the propulsion device 6 is simultaneously connected to a cleaner for muck 7. In this way, it ensures that the thrust is uniform during tunneling of the shield machine model, and the shield machine model is prevented from deviating from a predetermined trajectory.

The thrust rods 5 have two functions. On one hand, each of the thrust rods 5 is connected to a corresponding one of external propulsion devices 6, so as to provide forward thrust for the tunneling of the shield machine model. On the other hand, one end of each of the thrust rods 5 is coupled to a corresponding one of the cleaner for mucks 7 simultaneously, so that the muck between the inner shield body and the outer shield body can be absorbed out by the cleaner for muck 7 through the hole in the front part of each of the metal thrust rods 5. The cleaner for muck 7 is arranged on an electronic scale 8. The formation loss rate of each ring of shield propulsion can be accurately controlled through the reading of the electronic scale 8. Meanwhile, the function of removing the muck between the inner shield body and the outer shield body in time can also be realized. Therefore, it avoids that the space between the inner shield body and the outer shield body is stuffed after a plurality of rings of propulsion, which causes subsequent formation loss to not be simulated.

Figure 8:
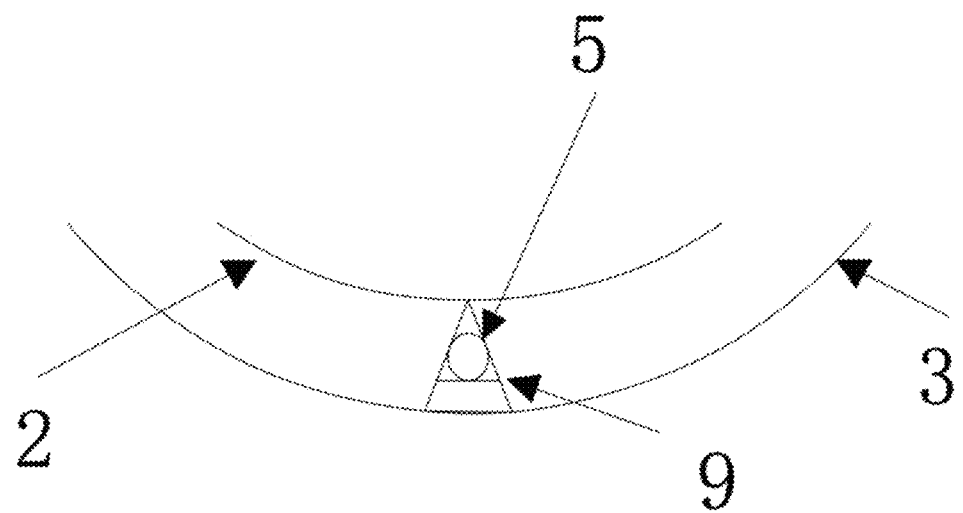
FIG. 8 is a schematic diagram of an anti-instability device of a thrust rod of a shield machine model according to the embodiments of the present disclosure.

Particularly, the thrust of the shield machine model is applied by means of four metal thrust rods 5 with holes. In order to prevent Eulerian yielding due to excessive pressure on a propulsion force, anti-instability triangular braces 9 of the metal thrust rods 5 are arranged in a shield body, as shown in FIG. 8. And, the supporting spacing between the every adjacent two of anti-instability triangular braces 9 is one-tenth the length of the shield machine model.

A cutter head 10 that is rotatable is arranged at the front part of the shield machine model. The cutter head 10 has a cutter. The cutter head 10 is rotated to cut soil, which is achieved by means of a torque rod. The cutter head of the shield machine model is welded to the torque rod 12. An end of the torque rod 12 is connected to a rotating motor 13. The rotating motor 13 is connected to an alternating current power supply 14. The torque rod 12 is driven through the rotation of the rotating motor 13, so as to drive the cutter head 10 to rotate to cut the soil.

In step D, five-dimensional monitoring is performed. Design an observation method for ground surface settlement data in terms of step lengths and time dimension, in combination with three-dimensional scanning, and five-dimensional data is acquired.

Further, the influence of the propulsion step length on the monitoring points is observed through continuous propulsion of the shield machine model. During the test, a constant propulsion speed P of the shield machine model is set, a size Q of each of the propulsion step lengths is set, and the constant propulsion speed P and the size Q are set to be constant values in one test. Test observation data of the ground surface monitoring points in the longitudinal direction under influence of the constant propulsion step lengths, and test observation data of the ground surface monitoring points in the transverse direction under influence of the constant propulsion step lengths are recorded.

A time dimension is monitored by transforming the downtime of the shield machine model, which specifically includes: two different time influences are acquired in the manner of designing two shutdown conditions of the shield machine model.

First, the shield machine model is shut down after being pushed to a position indicated by symbol $a_{2,3}$ or other intermediate position, and a shutdown position of the shield machine model is selected. The shutdown position is that the shield machine model is shut down when not passing through all set monitoring points completely, which mainly simulates a segment installation process in an actual construction process. In order to eliminate the influence of boundary conditions, an intermediate position is preferably selected as a model shutdown position. Then, the settlement situations at different monitoring points are recorded along with the increase of the downtime of the shield machine model. Data acquisition of the monitoring points is performed.

Second, data acquisition is performed at the monitoring points after the shield machine model is pushed over all monitoring points. During the test, a constant propulsion speed P' of the propulsion of the shield machine model is set, and a size Q' of each of the propulsion step lengths is set, and the constant propulsion speed P' and the size Q' are set to be constant values in the one test. A test observation record sheet under one of the two time dimension influences at the ground surface monitoring points is made, so as to record relevant data.

In step E, information processing for ground surface deformation is performed according to the ground surface settlement data in terms of propulsion step lengths and time dimension monitored in Step D. Finally, a table of five-dimensional information is finished through a deformation cloud chart, so as to acquire test data for the five dimensions.

After scanning, scanning point cloud is imported into Scene software. Configuration processing is performed on the point cloud by using a filter, so as to delete redundant point cloud for data reduction and de-noising. And, the de-noised point cloud is transformed into a general format to complete a pre-processing process.

The point cloud after the transformed format is enabled in 3DReshaper, coordinates of the monitoring point are selected by using a label adding function according to a layout rule of the monitoring points, and then coordinate configuration is performed.

Point cloud data at different times are matched by using a four-point marking method by using a Reference Point System (RPS) registration function. Finally, comparative analysis of the point cloud is performed, and a deformation cloud chart is generated, so as to obtain time data for the five dimensions for performing subsequent analysis processing and utilization.

The description above is only a preferred embodiment of the present disclosure, and is not intended to limit the present disclosure in any form. The technical contents disclosed above may be changed or modified into equivalent embodiments of equivalent changes by any of those skilled in the art, so as to be applied to other fields. However, any simple amendments, equivalent changes, and modifications made to the above embodiments in accordance with the technical essence of the present disclosure without departing from the contents of the technical solutions of the present disclosure still fall within the scope of protection of the technical solutions of the present disclosure.

What is claimed is:

1. A test method based on a test system for five-dimensional space effects of ground surface settlement caused by dual-mode shield construction, the test system comprising a test model box, a test monitoring system, and a shield machine model, the test model box being configured for simulating geological conditions in actual construction; the test method comprising:
   manufacturing a model with stratum similarity material: acquiring a geological exploration report of a region to be studied, and determining a test similarity ratio based on the geological exploration report in combination with a determination method of the similarity ratio, so as to manufacture the model with stratum similarity material based on the similarity ratio;
   arranging ground surface monitoring points in a longitudinal direction and a transverse direction: detecting an accuracy of the test monitoring system to select resolution suitable for the test method, and arranging the test monitoring system;
   installing the shield machine model, and performing shield construction,
       adopting a double-shield body mode for the shield machine model, and enabling the shield machine model to comprise an inner shield body (2) and an outer shield body (3) nested together, thrust rods (5), propulsion devices (6), and cleaners for muck (7); setting a front part of the outer shield body (3) to be a local hollow area (31); arranging corbel-like members (4) between the inner shield body (2) and the outer shield body (3); fixing one end of each of the thrust rods (5) to a corresponding one of the corbel-like members (4), and connecting an other end of the thrust rod (5) to a corresponding one of the propulsion devices (6); connecting the corresponding one of the propulsion devices (6) simultaneously to a respective one of the cleaners for muck (7);
       arranging a cutter head (10) with a cutter on a front part of the shield machine model; connecting the cutter head (10) to a rotating motor (13) through a torque rod (12); connecting the rotating motor (13) to an alternating current power supply (14); driving the torque rod (12) through rotation of the rotating motor (13), so as to drive the cutter head (10) to rotate to cut soil of the model with stratum similarity material;
   performing five-dimensional monitoring: designing an observation method for ground surface settlement data in terms of propulsion step lengths and time dimension, and acquiring five-dimensional data by the observation method in combination with three-dimensional scanning;
       observing influence of the propulsion step lengths on the ground surface monitoring points through continuous propulsion of the shield machine model and performing three-dimensional scanning record;
       monitoring the time dimension by changing downtime of the shield machine model; and
   performing information processing for ground surface deformation based on the ground surface settlement data in terms of propulsion step lengths and time dimension monitored in step of performing five-dimensional monitoring, so as to acquire the five-dimensional data.

2. The test method based on a test system for five-dimensional space effects of ground surface settlement caused by dual-mode shield construction according to claim 1, wherein arranging ground surface monitoring points in the longitudinal direction and the transverse direction comprises: adopting a three-dimensional laser scanner for the test monitoring system; arranging the ground surface monitoring points on a surface of the model with stratum similarity material placed in the test model box; enabling a starting point and an end point to be away from a boundary of the test model box to be not affected by conditions of the boundary.

3. The test method based on a test system for five-dimensional space effects of ground surface settlement caused by dual-mode shield construction according to claim 1, wherein observing influence of the propulsion step lengths on the ground surface monitoring points through continuous propulsion of the shield machine model and performing three-dimensional scanning record comprises: setting a constant propulsion speed P of the shield machine model, setting a size Q of each of the propulsion step lengths, and setting the constant propulsion speed P and the size Q to be constant values in one test; recording test observation data of the ground surface monitoring points in the longitudinal direction under influence of the constant propulsion step lengths, and test observation data of the ground surface monitoring points in the transverse direction under influence of the constant propulsion step lengths.

4. The test method based on a test system for five-dimensional space effects of ground surface settlement caused by dual-mode shield construction according to claim 1, wherein monitoring the time dimension by changing the downtime of the shield machine model specifically comprises:

acquiring the five-dimensional data under two different time dimension influences in a shutting-down mode of the shield machine model, wherein acquiring two different time dimension influences comprises:

pushing the shield machine model for construction, selecting a shutdown position of the shield machine model, and recording the five-dimensional data at the ground surface monitoring points along with increase of the downtime of the shield machine model; and performing data acquisition of the ground surface monitoring points after the shield machine model is pushed over the the ground surface monitoring points, during one test, setting a constant propulsion speed P' of the propulsion of the shield machine model, and setting a size Q' of each of the propulsion step lengths, setting the constant propulsion speed P' and the size Q' to be constant values in the one test; and making a test observation record sheet under one of the two time dimension influences at the ground surface monitoring points, so as to record the five-dimensional data.

5. The test method based on a test system for five-dimensional space effects of ground surface settlement caused by dual-mode shield construction according to claim 1, wherein installing the shield machine model, and performing shield construction comprises: enabling the thrust rods (5) to be hollow internally; forming a hole in a side wall of one end, close to the corbel-like members (4), of each of the thrust rods (5); locating the thrust rods (5) between the inner shield body (2) and the outer shield body (3), and arranging the plurality of the thrust rods (5) uniformly in a circumferential direction of the inner shield body.

6. The test method based on a test system for five-dimensional space effects of ground surface settlement caused by dual-mode shield construction according to claim 5, further comprising: arranging anti-instability triangular braces (9) for supporting the thrust rods (5) between the inner shield body (2) and the outer shield body (3); and enabling a supporting spacing between every adjacent two of the triangular braces (9) to be one-tenth a length of the shield machine model.

7. The test method based on a test system for five-dimensional space effects of ground surface settlement caused by dual-mode shield construction according to claim 1, further comprising: enabling a hollow range of the hollow area (31) to be one-fourth to one-third a length of the shield machine model.

8. The test method based on a test system for five-dimensional space effects of ground surface settlement caused by dual-mode shield construction according to claim t, further comprising: arranging muck retaining plates (15) at a position from one-third to one-half a front end of the shield machine model; arranging the muck retaining plates (15) between the inner shield body (2) and the outer shield body (3), and locating the muck retaining plates (15) behind the hollow area (31); and forming a sealed space at a space in front of the muck retaining plate (5).

9. The test method based on a test system for five-dimensional space effects of ground surface settlement caused by dual-mode shield construction according to claim 1, wherein manufacturing a model with stratum similarity material comprises: placing the model with stratum similarity material after being manufactured into the test model box; enabling the test model box to comprise a box body (1) with an opening in an upper part thereof; simulating similarity stratum in the box body; installing tempered glass plates on sides of the box body; installing a steel plate on a bottom of the box body; connecting every adjacent two of the tempered glass plates by using double-leg angle steel (11), and using sealant to improve sealing performance; and simulating material of stratum rock by using the stratum similarity material to be similar to the stratum rock, wherein the stratum similarity material comprises quartz sand, mica, barite powder, river sand, and cement; and pouring the model with the stratum similarity material in layers and vibrating and compacting manually the model with the stratum similarity material.

* * * * *